United States Patent [19]

Sim

[11] Patent Number: 5,438,545
[45] Date of Patent: Aug. 1, 1995

[54] DATA OUTPUT BUFFER OF SEMICONDUCTOR MEMORY DEVICE FOR PREVENTING NOISES

[75] Inventor: Jae K. Sim, Chungcheongbuk, Rep. of Korea

[73] Assignee: Goldstar Electron Co., Ltd., Rep. of Korea

[21] Appl. No.: 200,818

[22] Filed: Feb. 23, 1994

[30] Foreign Application Priority Data

Dec. 21, 1993 [KR] Rep. of Korea .................. 28855

[51] Int. Cl.$^6$ .................................... H03K 17/16
[52] U.S. Cl. .................... 365/189.05; 326/27; 326/83
[58] Field of Search ............ 365/189.05; 307/443, 307/448, 451

[56] References Cited

U.S. PATENT DOCUMENTS

| | | | |
|---|---|---|---|
| 4,985,644 | 1/1991 | Okihara | 365/189.05 X |
| 5,059,823 | 10/1991 | Ahsanullah | 307/443 |
| 5,151,621 | 9/1992 | Goto | 307/443 X |
| 5,239,211 | 8/1993 | Jinbo | 307/443 |
| 5,815,172 | 5/1994 | Reddy | 307/443 |

FOREIGN PATENT DOCUMENTS

2257856 10/1992 United Kingdom .

*Primary Examiner*—Joseph A. Popek
*Assistant Examiner*—Son Mai
*Attorney, Agent, or Firm*—Poms, Smith, Lande & Rose

[57] ABSTRACT

A data output buffer, which includes a data output driver which in turn includes a pull-up circuit (14) operating in response to a first signal and a pull-down circuit (I10) operating in response to a second signal, and a control circuit for sensing a current flowing into the pull-down circuit via a feed-back and controlling the slope of the second signal in accordance with the sensed current. The control circuit includes a sensing circuit (I13) for sensing current flowing into the pull-down circuit upon driving data, and the magnitude of noises generated at the actual ground line ($GND_1 + GND_2$) due to the current, a voltage adjustment circuit (I4) which operates in response to the output signal of the sensing circuit and thereby adjusts the gate voltage of the pull-down circuit. Thereby, the noises generated in the chip are repressed without affecting the operational speed of the chip.

4 Claims, 5 Drawing Sheets

DATA OUTPUT BUFFER OF SEMICONDUCTOR MEMORY DEVICE FOR PREVENTING NOISES

BACKGROUND OF THE INVENTION

The present invention relates to a semiconductor memory device, and more particularly to a data output buffer of a semiconductor memory device.

In general, noises are important to the operational speed and reliability of semiconductor memory devices. Therefore, considerable research has been conducted to remove noises occurring in chips. The noises that are generated at the data output buffer during the operation of data are especially serious. A technique for reducing noises has been suggested in United Kingdom patent publication No. GB 2 257 856 A.

FIG. 1 shows a conventional data output buffer. In FIG. 1, a pair of data D, D̄ denotes the output signals of a sense amplifier (not shown in FIG. 1) and an output enabling signal OE denotes the signal for enabling the output of the pair of data D, D̄. As shown in FIG. 1, the data output buffer comprises a data input buffer for receiving the data D and the output enabling signal OE, an inversion data input buffer for receiving the inversion data D̄ and the output enabling signal OE, a data output driver connected to the output terminals of the data input buffer and the inversion data input buffer, a first control circuit 12 for delaying the transition of output signal from the data input buffer during the transition from the "HIGH" state to "LOW" state and a second control circuit 13 for delaying the transition of the output signal from the inversion data input buffer during the transition from the "LOW" state to "HIGH" state.

The data input buffer comprises a NAND gate for receiving the data D and the output enabling signal OE, an inverter 2 for inverting the output signal of the NAND gate 1, a P-MOS transistor 3 having a source electrode in which a voltage source Vcc is supplied, and a gate electrode in which the output signal of the inverter 2 is received, an N-MOS transistor 4 having a source electrode in which a ground potential Vss is supplied, a gate electrode in which the output signal of the inverter 2 is received and a drain electrode connected to a drain electrode of the P-MOS transistor 3.

The inversion data input buffer comprises a NAND gate 6 for receiving the inversion data D̄ and the output enabling signal OE, a P-MOS transistor 7 having a gate electrode in which the output signal of the NAN D gate 6 is received and a source electrode in which the voltage source Vcc is supplied, an N-MOS transistor 8 having a gate electrode in which the output signal of the NAND gate 6 is received, a source electrode to which the ground potential Vss is supplied and a drain electrode connected to a drain electrode of the P-MOS transistor 7.

The data output driver comprises a P-MOS transistor 10 having a gate electrode which receives the output signal of an inverter 5, which is comprised of the P-MOS transistor 3 and the N-MOS transistor 4, and a source electrode in which the voltage source Vcc is supplied and an N-MOS transistor 11 having a gate electrode which receives the output signal of an inverter 9, which is comprised of the P-MOS transistor 7 and the N-MOS transistor 8, a source electrode connected to the ground potential Vss and a drain electrode connected to the drain electrode of the P-MOS transistor 10. Therefore, a data output signal Dout is generated via the common connection point between the N-MOS transistor 11 and the P-MOS transistor 10.

FIG. 1 illustrates an embodiment of a data output buffer according to this invention. In FIG. 1, a first control circuit 12 is shown to comprise a first delay portion 12A and a first slope control portion means 12B. The first delay portion 12A includes a first inverter 14 receiving an output signal Dd from inverter 2, and second and third inverters 15 and 16 both connected in series with the first inverter 14. The first slope control portion means 12B includes a first N-MOS transistor 17 having a gate electrode applied with an output signal S3 from the third inverter 16, a source electrode connected to a ground potential Vss, and a drain electrode connected to the source electrode of an N-MOS transistor 4, and a second N-MOS transistor 18 having a gate electrode applied with a voltage source Vcc and drain and source electrodes connected, respectively, to the drain and source electrodes of the first N-MOS transistor 17. The second N-MOS transistor 18 operates as a constant current source.

A second control circuit 13 includes a second delay portion 13A and a second slope control portion means 13B. Second delay portion 13A comprises a fourth inverter 19 receiving an output signal D̄d from NAND gate 6, arid fifth and sixth inverters 20 and 21 both connected in series with the fourth inverter 19. The second slope control portion means 13B comprises a first P-MOS transistor 22 having a gate electrode applied with an output signal $6 from the sixth inverter 21, a source electrode applied with a voltage source Vcc, and a drain electrode connected to the source electrode of a P-MOS transistor 7, and a second P-MOS transistor 23 having a gate electrode applied with a ground potential Vss and drain and source electrodes connected, respectively, with the drain and source electrodes of the first P-MOS transistor 22. The second P-MOS transistor 23 operates as a constant current source.

According to the above, however, because it is carried out to limit the occurrence of noises having no relation with the occurrence of noises and the ramp speed is controlled slowly in low speed under a condition in which the data output driver is turned on, there is a disadvantage in that the operational speed may be reduced.

SUMMARY OF THE INVENTION

Therefore, an object of the present invention is to provide a data output buffer capable of preventing the occurrence of noises by detecting the noise-magnitude of the actual ground line and controlling its output terminal in accordance with the detected information.

In accordance with the present invention, this object can be accomplished by providing a data output buffer comprising a data output driver, which includes a pull-up circuit operated in response to a first signal and a pull-down circuit operated in response to a second signal, and a control circuit for detecting the current flowing into the pull-down circuit and then controlling the slope of the second signal in accordance with the detected current.

DETAILED DESCRIPTION OF THE PREFERRED EMBODIMENT

Figure 1:
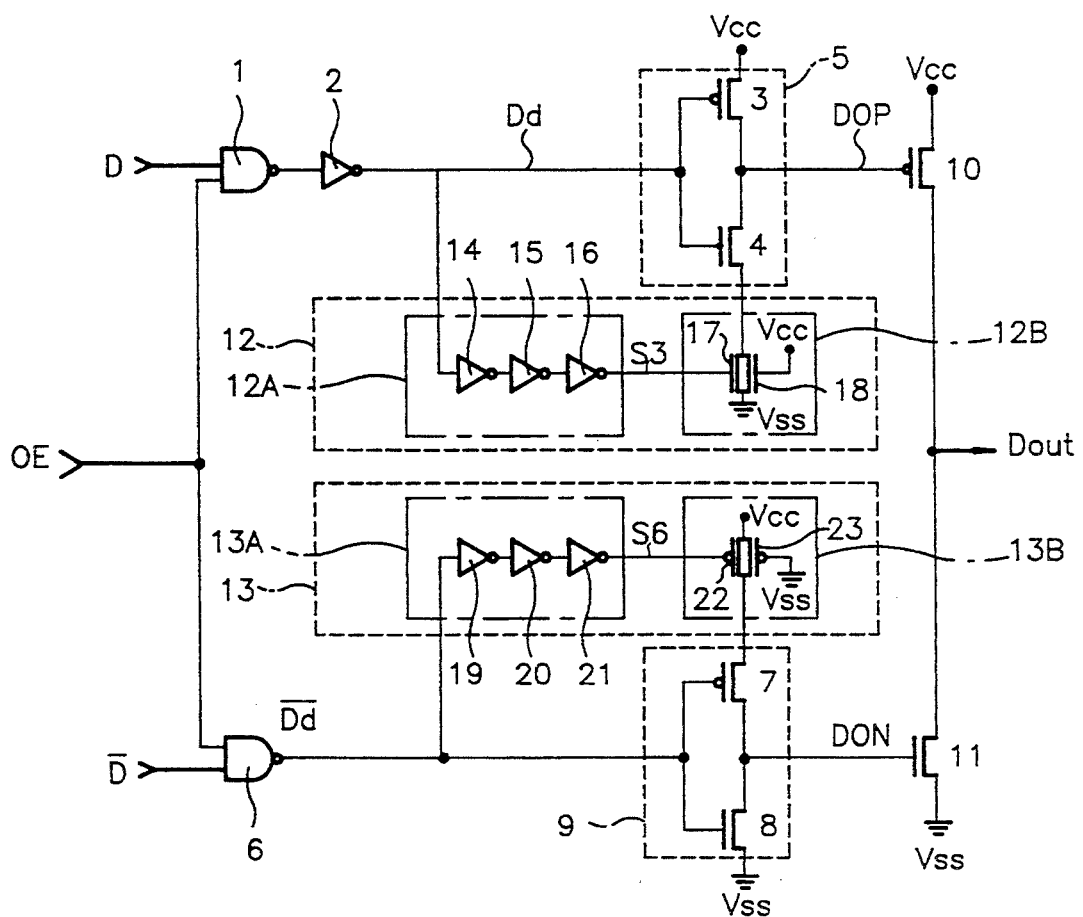
FIG. 1 shows a data output buffer of the prior art.
Figure 2A:
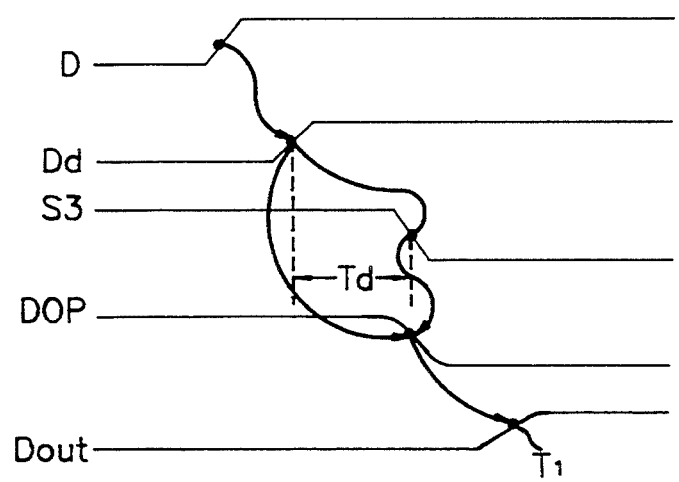
FIGS. 2A and 2B are operational timing diagrams describing the operation of the prior art circuit shown in FIG. 1.
Figure 2B:
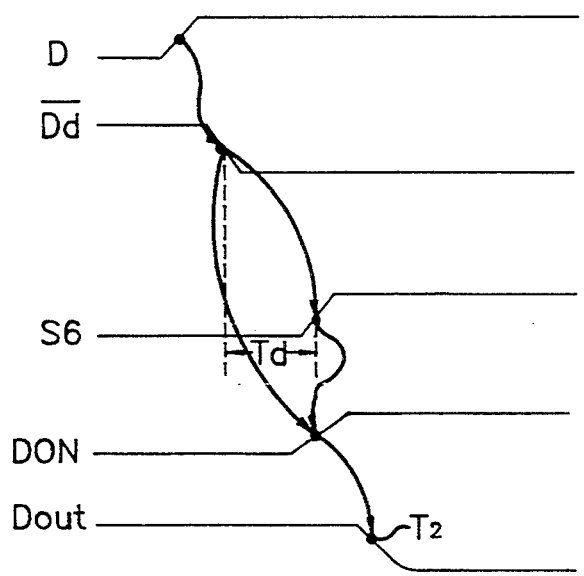
Figure 3:
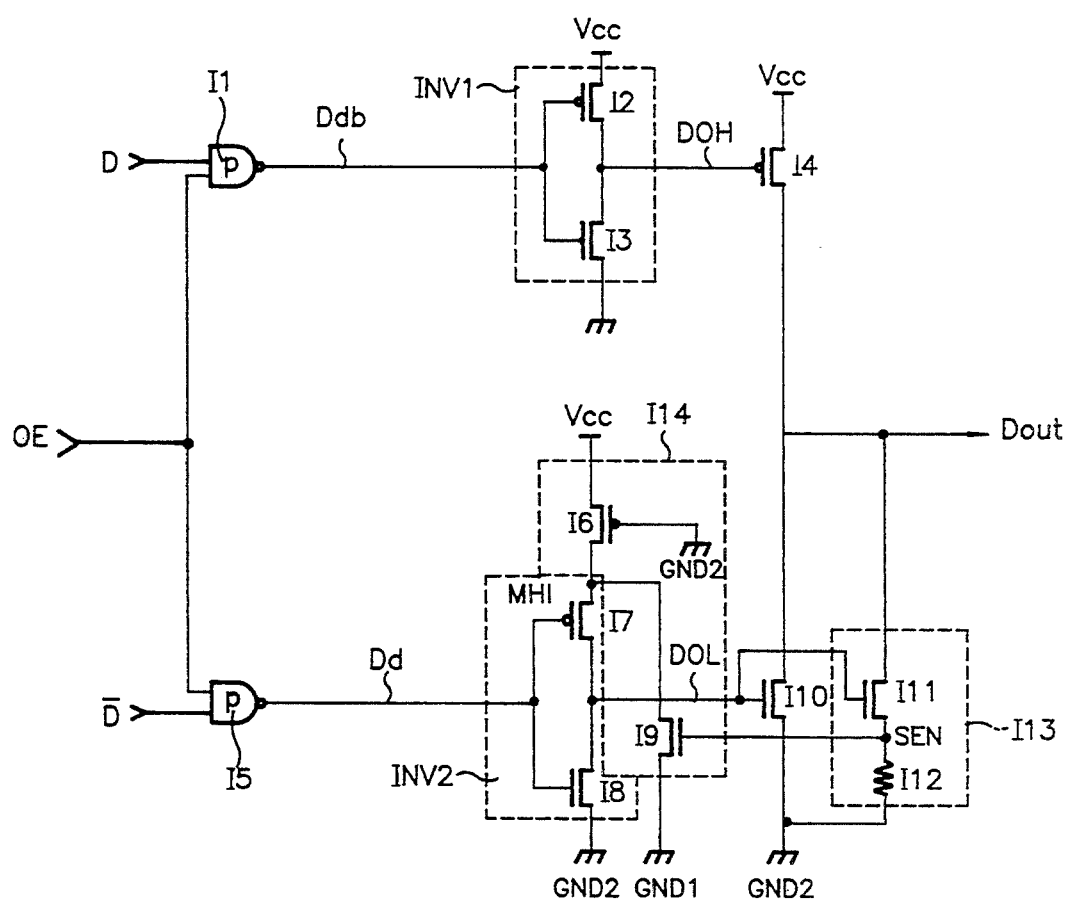
FIG. 3 schematically illustrates a data output buffer in accordance with the present invention.

FIG. 3 schematically illustrates a data output buffer in accordance with the present invention. Comparing it with the data output buffer of FIG. 1, excepting the first control circuit and the second control circuit as shown in FIG. 3, a data output buffer according to the present invention further comprises a sensing circuit I13 for sensing the magnitude of noises included in a ground line and a current flowing therein upon turning the data output driver on, and a voltage adjustment circuit I14 for adjusting the gate voltage of the pull-down circuit in the data output driver by being driven in accordance with the output signal of the sensing circuit I13.

The sensing circuit I13 comprises an N-MOS transistor I11 and a current sense resistor $R_S$ connected between the source electrode of the N-MOS transistor I11 and a second ground potential GND2. The N-MOS transistor I11 includes a gate electrode connected to output signal DOL of an inverter INV2 which includes a P-MOS transistor I7 and an N-MOS transistor I8, and a drain electrode connected to the output Dout of the data output driver, which includes a P-MOS transistor I4 and an N-MOS transistor I10.

The voltage adjustment circuit I14 comprises a P-MOS transistor I6 and an N-MOS transistor I9. The P-MOS transistor I6 includes a source electrode connected to voltage source Vcc, a gate electrode connected to the second ground potential GND2 and a drain electrode connected to the source of the P-MOS transistor I7. The N-MOS transistor I9 includes a gate electrode connected to a common turning point between the N-MOS transistor I11 and the current sense resistor $R_S$, a drain electrode connected to the drain electrode of the P-MOS transistor I6, and a source electrode connected to a first ground potential GND1.

Figure 4:
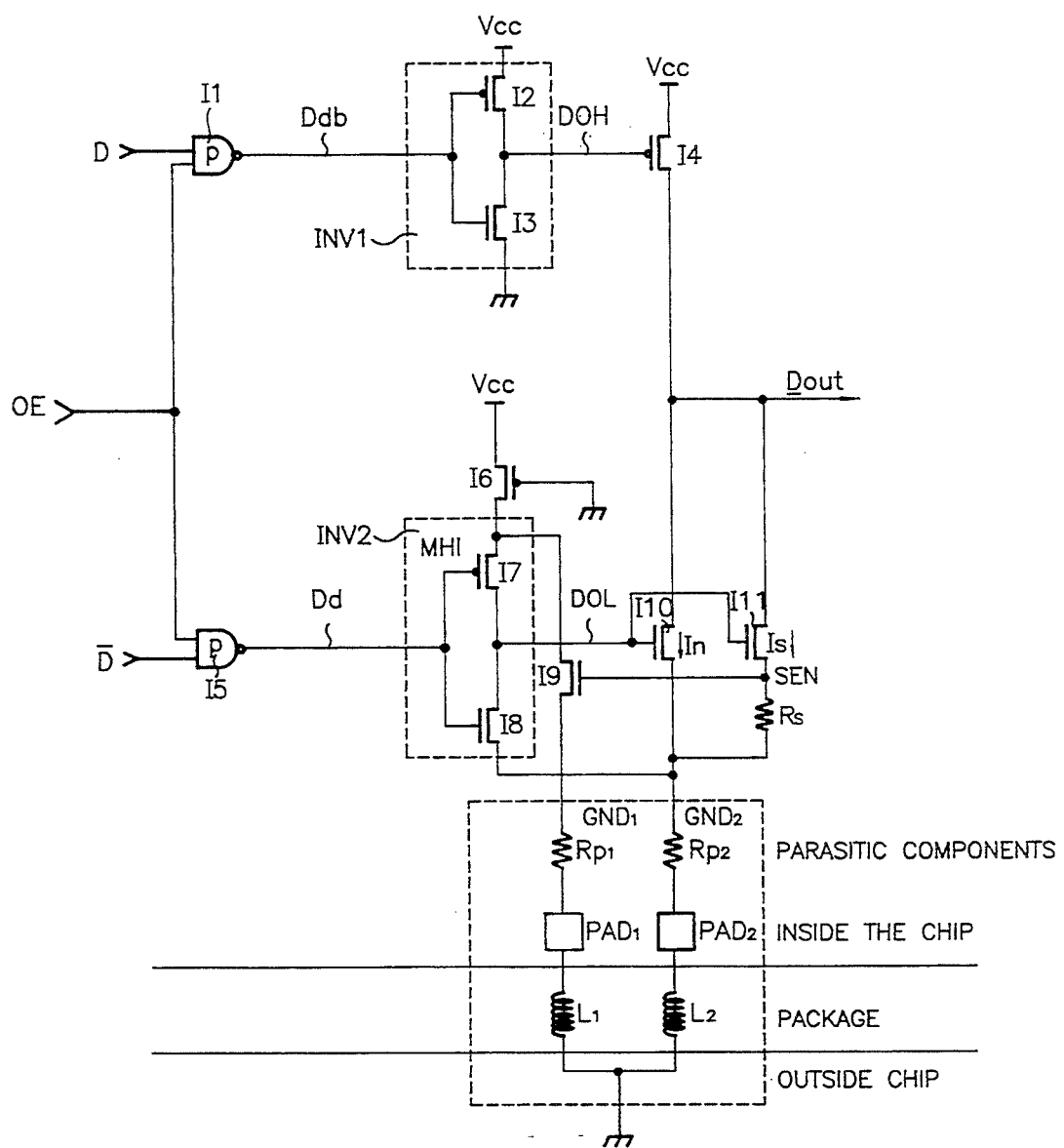
FIG. 4 shows an embodiment of a data output buffer in accordance with the present invention.

FIG. 4 shows an embodiment of the data output buffer in accordance with the present invention. In FIG. 4, the parts corresponding to the first ground GND1 and the second ground GND2 of FIG. 3 are illustrated in more detail. The first ground GND1 includes a first parasitic resistance $R_{P1}$, a first pad PAD1 connected to the first parasitic resistance $R_{P1}$ and a first coupling L1 coil or inductance (i.e., bonding wire) connected between the first pad PAD 1 and a ground. The second ground GND2 includes a second parasitic resistance $R_{P2}$, a second pad PAD2 connected to the second parasitic resistance $R_{P2}$ and a second inductance $L_2$ connected between the second pad PAD2 a ground.

Figure 5:
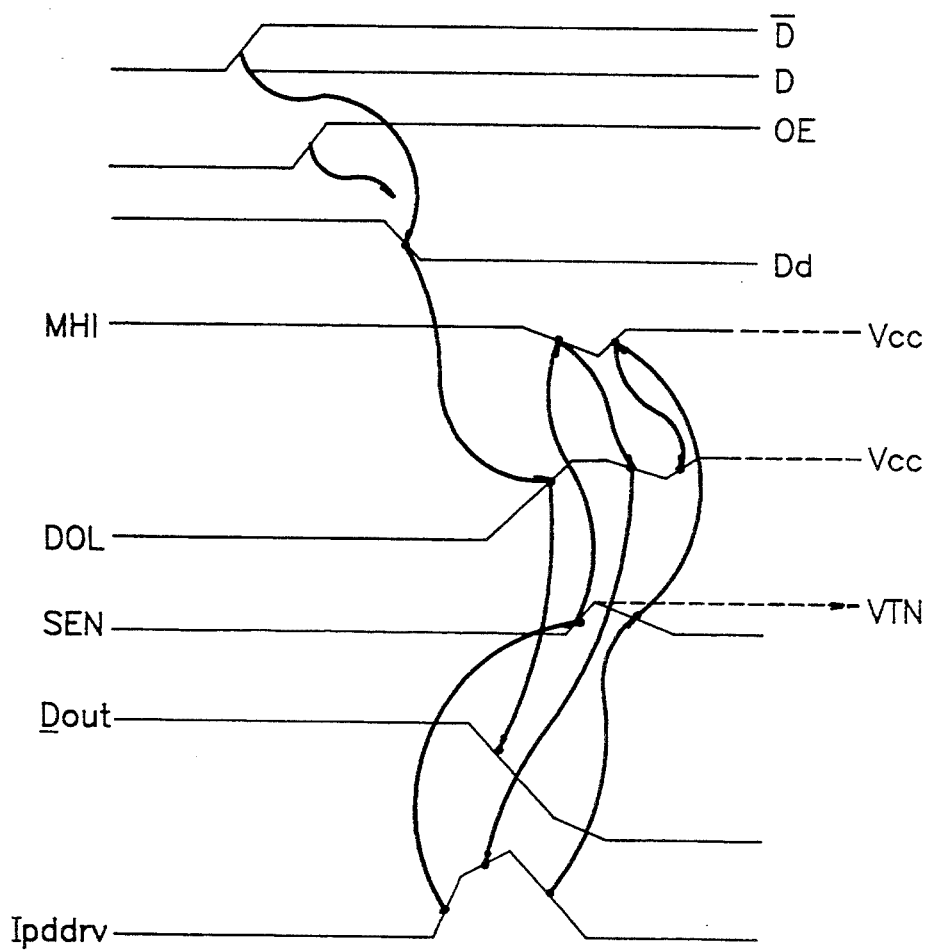
FIG. 5 is an operational timing diagram describing the operation of the circuit shown in FIG. 4.

FIG. 5 is an operational diagram describing the operation of the circuit shown in FIG. 4 when an output signal Dd of a NAND gate I5 is changed from a "HIGH" state to a "LOW" state. Assuming that inversion data $\underline{D}$ and an output enable signal OE are simultaneously changed from a "LOW" state to a "HIGH" state, the P-MOS transistor I7 is turned on and the N-MOS transistor I8 is turned off when the output signal Dd in FIG. 5 is changed from a "HIGH" state to a "LOW" state.

The P-MOS transistor I6 always maintains a turned on state because the second ground potential GND2 is always supplied into it via its gate electrode. That is, the P-MOS transistor I6 is provided to pre-charge a turning point MI. Since the turning point MHI is pre-charged with the voltage source Vcc via the P-MOS transistor I6, the output DOL of the inverter INV2 changes to a "HIGH" state when the P-MOS transistor I7 is turned on.

Gates of the N-MOS transistors I10, I11 are connected to the output DOL of the inverter INV2. Therefore, the N-MOS transistors I10, I11 are turned on when the output DOL of the inverter INV2 reaches a "HIGH" level. When it does, the potential level of output Dour starts to change to the "LOW" state. As a result, the output Dout starts to discharge to the second ground GND2 via the N-MOS transistor I10 and simultaneously to discharge to the second ground GND2 via the N-MOS transistor I11 and the current sensing resistor $R_S$.

The magnitude of the N-MOS transistor I 11 has been previously adjusted so that the quantity of current flowing into it has a proper magnitude. Since the current Is flowing into the N-MOS transistor I11 is much less than the current In flowing into the N-MOS transistor I10, the current $I_S$ can be neglected in accordance with the potential $V_{GND2}$. Accordingly, the potential $V_{GND2}$ of the second ground GND2 can be represented by the following equation:

$$V_{GND2} = IN \times R_{p2} + L_2 \frac{Din}{dt}$$

This corresponds to the magnitude of noises occurring due to the potential discharge of output Dour.

A turning point SEN between the source electrode of the N-MOS transistor I11 and the current sense resistor $R_S$ is connected to the gate electrode of the N-MOS transistor I9. The potential of the turning point SEN corresponds to $V_{GND2} + I_S \times R_S$. The potential difference $V_{GS}$ between the gate electrode of the N-MOS transistor I9 and the source electrode of the N-MOS transistor I9 becomes also corresponding to $V_{GND2} + I_S \times R_S - V_{GND1}$. Herein, $V_{GND1}$ corresponds to the potential of the first ground GND1.

The N-MOS transistor I9 is turned on when the potential difference VGS between the gate electrode of the N-MOS transistor I9 and its source electrode is larger than its threshold voltage $V_{TH}$. Therefore, the potential of the turning point MHI is discharged to the first ground GND1 via the N-MOS transistor I9, thereby causing the potential of the turning point MHI to be at a "LOW" level.

At this time, since the P-MOS transistor I7 continuously maintains the turned on state, the output level of the inverter INV2 is changed to the "LOW" level as the potential of the turning point MHI becomes "LOW" level. As a result, the driving voltage of the N-MOS transistors I10, I11 drops and the currents In and Is flowing into the transistors I10, I11 are reduced.

At this time, the N-MOS transistor I9 is turned off if the potential difference $V_{GS}$ between the gate electrode of the N-MOS transistor I9 and its source electrode is smaller than its threshold voltage $V_{TH}$. The potential of the turning point MHI is again charged with the voltage source Vcc via the P-MOS transistor I6 as the N-MOS transistor I9 is turned off. Since the P-MOS transistor I7 maintains the turned-on sate, the output DOL of the inverter INV2 is also changed to the "HIGH" level.

If the output DOL of the inverter INV2 is larger than the threshold voltage of the N-MOS transistors I10, I11, the N-MOS transistors I10, I11 are again turned on. That is, the potential of the second ground GND2 generated in accordance with the current movement of the N-MOS transistor I10 senses the magnitude of the noise level and again adjusts the potential $V_{GND1}$ of the second ground GND2 in accordance with the quantity of current flowing into the N-MOS transistor I10, thereby enabling the level of noise to be automatically lowered.

According to the present invention, as above mentioned, there is the advantage in that the data output buffer senses the magnitude of noise generated at the ground of the pull-down means and adjusts the current of the data output driver via a feed-back path, thereby preventing noises from occurring.

What is claimed is:

1. A data output buffer, comprising:
a data output driver including pull-up means operable in response to a first signal and pull-down means operable in response to a second signal;
control means for detecting a current flowing into said pull-down means and for controlling the slope of the second signal in accordance with the detected current;
wherein said control means includes an inverter and sensing means for sensing the current flowing into said pull-down means and the magnitude of noises generated at the ground of said pull-down means; and
voltage adjusting means operable in accordance with an output signal of said sensing means for adjusting a gate voltage of said pull-down means;
wherein said sensing means includes (a) an N-MOS transistor which has a gate electrode for receiving an output signal of the inverter, a drain electrode connected to an output of said data output driver, and a source electrode, and (b) a current sensing resistor connected in between said source electrode and the ground.

2. A data output buffer, comprising:
a data output driver including pull-up means operable in response to a first signal and pull-down means operable in response to a second signal;
control means for detecting a current flowing into said pull-down means and for controlling the slope of the second signal in accordance with the detected current;
wherein said control means includes an inverter and sensing means for sensing the current flowing into said pull-down means and the magnitude of noises generated at the ground of said pull-down means; and
voltage adjusting means operable in accordance with an output signal of said sensing means for adjusting a gate voltage of said pull-down means;
wherein said voltage adjusting means includes (a) a P-MOS transistor which has a gate electrode connected to a second ground, a source electrode connected to a voltage source and a drain electrode connected to an inverter, and (b) an N-MOS transistor which has a gate electrode connected to said sensing means, a source electrode connected to a first ground, and a drain electrode connected to said drain electrode of said P-MOS transistor.

3. A data output buffer, comprising:
data buffer means for buffering data signals;
inversion data buffer means for buffering inversion data signals;
a data output driver which includes a pull-up means operable in response to an output signal of said data buffer means and a pull-down means operable in response to an output signal of said inversion data buffer means;
control means for sensing a current flowing into said pull-down means via a feed-back and controlling the output signal of said inversion data buffer means;
wherein said control means includes sensing means for sensing a current flowing into said pull-down means upon driving data and the magnitude of noises generated at the ground of said pull-down means in accordance with the current; and
voltage adjustment means operable in accordance with an output signal of said sensing means for adjusting the gate voltage of said pull-down means;
wherein said sensing means includes an N-MOS transistor having a drain electrode connected to an output of said data output driver, a gate electrode for receiving an output signal of an inverter; and
a current sensing resister connected in series between a source electrode of said N-MOS transistor and the ground.

4. A data output buffer, comprising:
data buffer means for buffering data signals;
inversion data buffer means for buffering inversion data signals;
a data output driver which includes a pull-up means operable in response to an output signal of said data buffer means and a pull-down means operable in response to an output signal of said inversion data buffer means;
control means for sensing a current flowing into said pull-down means via a feed-back and controlling the output signal of said inversion data buffer means;
wherein said control means includes sensing means for sensing a current flowing into said pull-down means upon driving data and the magnitude of noises generated at a first ground and a second ground in accordance with the current; and
voltage adjusting means operable in accordance with an output signal of said sensing means for adjusting the gate voltage of said pull-down means;
wherein said voltage adjusting means includes (a) a P-MOS transistor having a gate electrode connected to the second ground, a source electrode connected to a voltage source and a drain electrode connected to an inverter, and (b) an N-MOS transistor having a gate electrode connected to said sensing means, a source electrode connected to the first ground and a drain electrode connected to said drain electrode of said P-MOS transistor.

* * * * *